(12) United States Patent
Jeong

(10) Patent No.: US 9,208,898 B2
(45) Date of Patent: Dec. 8, 2015

(54) SEMICONDUCTOR DEVICE AND OPERATING METHOD OF SEMICONDUCTOR DEVICE

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 213 days.

(21) Appl. No.: 14/106,808

(22) Filed: Dec. 15, 2013

(65) Prior Publication Data
US 2015/0061721 A1    Mar. 5, 2015

(30) Foreign Application Priority Data

Aug. 30, 2013 (KR) .................... 10-2013-0103965

(51) Int. Cl.
*G01R 31/02*   (2006.01)
*G11C 29/02*   (2006.01)
*G01R 31/3185* (2006.01)

(52) U.S. Cl.
CPC ...... *G11C 29/025* (2013.01); *G01R 31/318513* (2013.01)

(58) Field of Classification Search
CPC .................. G01R 31/3177; G01R 31/318536; G01N 2015/1006; G01N 33/5005
USPC ............................... 324/762.01–763.01, 500, 324/757.02–757.04, 754.18; 714/726–727, 714/E11.155; 257/48, 565, 620, 723–734
See application file for complete search history.

(56) References Cited

U.S. PATENT DOCUMENTS

| 8,593,170 | B2 * | 11/2013 | Van der Plas | G01R 31/318513 324/762.03 |
| 8,680,874 | B2 * | 3/2014 | Minas | G01R 31/2853 324/606 |
| 2011/0102011 | A1 | 5/2011 | Van der Plas et al. | |
| 2012/0248438 | A1 | 10/2012 | Lung et al. | |

FOREIGN PATENT DOCUMENTS

KR    1020110046894    5/2011

* cited by examiner

*Primary Examiner* — Melissa Koval
*Assistant Examiner* — Trung Nguyen
(74) *Attorney, Agent, or Firm* — IP & T Group LLP

(57) ABSTRACT

A semiconductor device includes a plurality of stacked chips, a reference through silicon via (TSV) set passing through the plurality of stacked chips, a plurality of TSVs passing through the plurality of stacked chips, a reference delay information generation unit suitable for generating a reference delay information indicating an amount of delay of the reference TSV set and a determination unit suitable for determining abnormality of the plurality of TSVs by comparing a first test signal with each of a plurality of second test signals, wherein the first test signal is an initial test signal delayed by an amount of delay corresponding to the reference delay information, and wherein each of the plurality of second test signals is the initial test signal delayed by corresponding one of the plurality of TSVs.

18 Claims, 7 Drawing Sheets

(A)

(B)

(C)

SEMICONDUCTOR DEVICE AND OPERATING METHOD OF SEMICONDUCTOR DEVICE

CROSS-REFERENCE TO RELATED APPLICATION

The present application claims priority of Korean Patent Application No. 10-2013-0103965, filed on Aug. 30, 2013, which is incorporated herein by reference in its entirety.

BACKGROUND

1. Field

Exemplary embodiments of the present invention relate to a semiconductor device for determining abnormality of a through silicon via (TSV) through an AC signal transfer characteristic and an operating method of the semiconductor device.

2. Description of the Related Art

Recently, there are continuous needs for high-speed, high-density and low power consumption for a semiconductor memory. In order to satisfy the needs, improved speed, increased density, and reduced power consumption need to be realized within a limited package space. In line with the needs, the integration degree of the semiconductor memory has been improved through scaling-down for reducing the critical dimension of the semiconductor memory. However, recently, the scaling-down has reached the limit of reducing the critical dimension. As a solution for the limit, stack package technology is actively developed. This 3 dimensional package stack technology may improve the integration degree within the limited space because two or more chips or dies are vertically stacked in a small area.

FIG. 1 is a schematic sectional view illustrating the TSV in accordance with a prior art.

FIG. 1 (A) shows a normally formed TSV of a semiconductor chip. Referring to FIG. 1 (A), a path penetrating a wafer layer is formed and a metal layer made of metallic materials is formed in the path. An insulating layer made of, for example, oxide is formed on the TSV in order to insulate the metal layer and the wafer layer from each other.

FIGS. 1 (B) and 1 (C) show abnormally formed TSVs. The metal layer is not normally formed in a path surrounded by the insulating layer. According to unexpected variation of process conditions for generating a TSV, the metal layer may be incompletely formed in a process of forming the metal layer. That is, as shown in FIG. 1 (B), an open type gap is formed in an interface where the metal layer and a metal electrode are coupled. In this case of FIG. 1 (B), the TSV cannot transfer a signal because a current path is not formed between electrodes. As shown in (C), a void type gap is formed within the metal layer. In this case of FIG. 1 (C), a current path between electrodes may be formed, but the current path has a high resistance attributable to the void type gap. As a result, the TSV cannot transfer a signal stably.

FIG. 2 is a schematic sectional view illustrating the TSV in a plurality of stacked chips in accordance with a prior art.

Referring to FIG. 2, a first chip 120 and a second chip 140, in each of which corresponding TSVs are formed, are coupled. Bumps electrically coupled with the TSV are formed at both ends of each of the TSVs.

FIGS. 2 (A) and 2 (B) show abnormally formed bumps, which is a process error. As shown in FIG. 2 (A), a bump coupled with a TSV of the second chip 140 is not aligned with a bump coupled with a TSV of the first chip 120. As shown in FIG. 2 (B), a bump is not formed at a TSV of the second chip 140. As a result, referring to FIGS. 2 (A) and 2(B), the bumps coupled with the TSVs of the first chip 120 and the second chip 140 are not electrically coupled or the bumps have high resistance although they are electrically coupled. Therefore, a signal cannot be normally communicated because an AC signal transfer characteristic of a TSV is greatly deteriorated.

For this reason, it may be desirable to determine abnormality of the AC signal transfer characteristic of a TSV after packaging the stacked chips. This is because a chip may not operate normally when the AC signal transfer characteristic of a TSV is deteriorated although the direct current (DC) signal transfer characteristic of the TSV is normal. In order to meet the necessity, there is a need for a circuit for determining abnormality of the AC signal transfer characteristic of a TSV after packaging the stacked chips.

SUMMARY

Exemplary embodiment of the present invention is directed to a semiconductor device for determining abnormality of a TSV after packaging a stacked package of plural chips.

In accordance with an embodiment of the present invention, a semiconductor device may include a plurality of stacked chips, a reference through silicon via (TSV) set passing through the plurality of stacked chips, a plurality of TSVs passing through the plurality of stacked chips, a reference delay information generation unit suitable for generating a reference delay information indicating an amount of delay of the reference TSV set and a determination unit suitable for determining abnormality of the plurality of TSVs by comparing a first test signal with each of a plurality of second test signals, wherein the first test signal is an initial test signal delayed by an amount of delay corresponding to the reference delay information, and wherein each of the plurality of second test signals is the initial test signal delayed by corresponding one of the plurality of TSVs.

In accordance with another embodiment of the present invention, an operating method of a semiconductor device including a plurality of stacked chips, a reference through silicon via (TSV) set passing through the plurality of stacked chips and a plurality of TSVs passing through the plurality of stacked chips may include generating a reference delay information indicating an amount of delay of the reference TSV set and determining abnormality of the plurality of TSVs by comparing a first test signal with each of a plurality of second test signals, wherein the first test signal is an initial test signal delayed by an amount of delay corresponding to the reference delay information, and wherein each of the plurality of second test signals is the initial test signal delayed by corresponding one of the plurality of TSVs.

DETAILED DESCRIPTION

Figure 1:
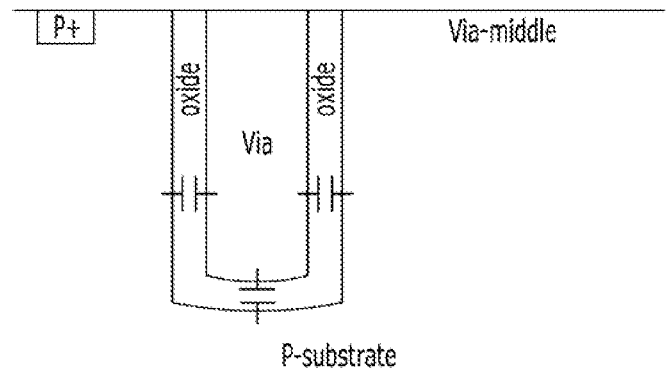
FIG. 1 is a schematic sectional view illustrating a TSV in accordance with a prior art.
Figure 1:
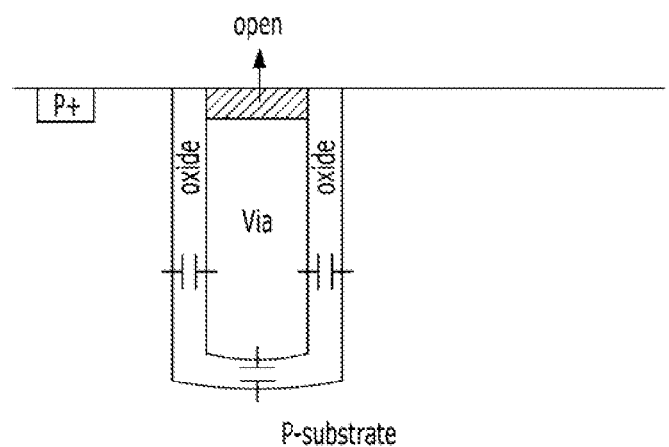
Figure 1:
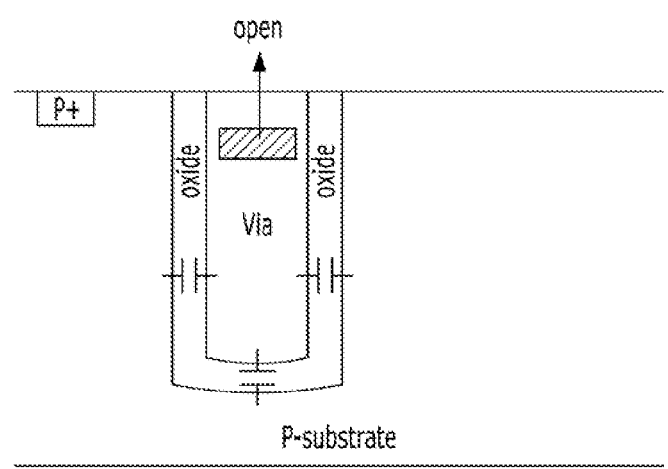
Figure 2:
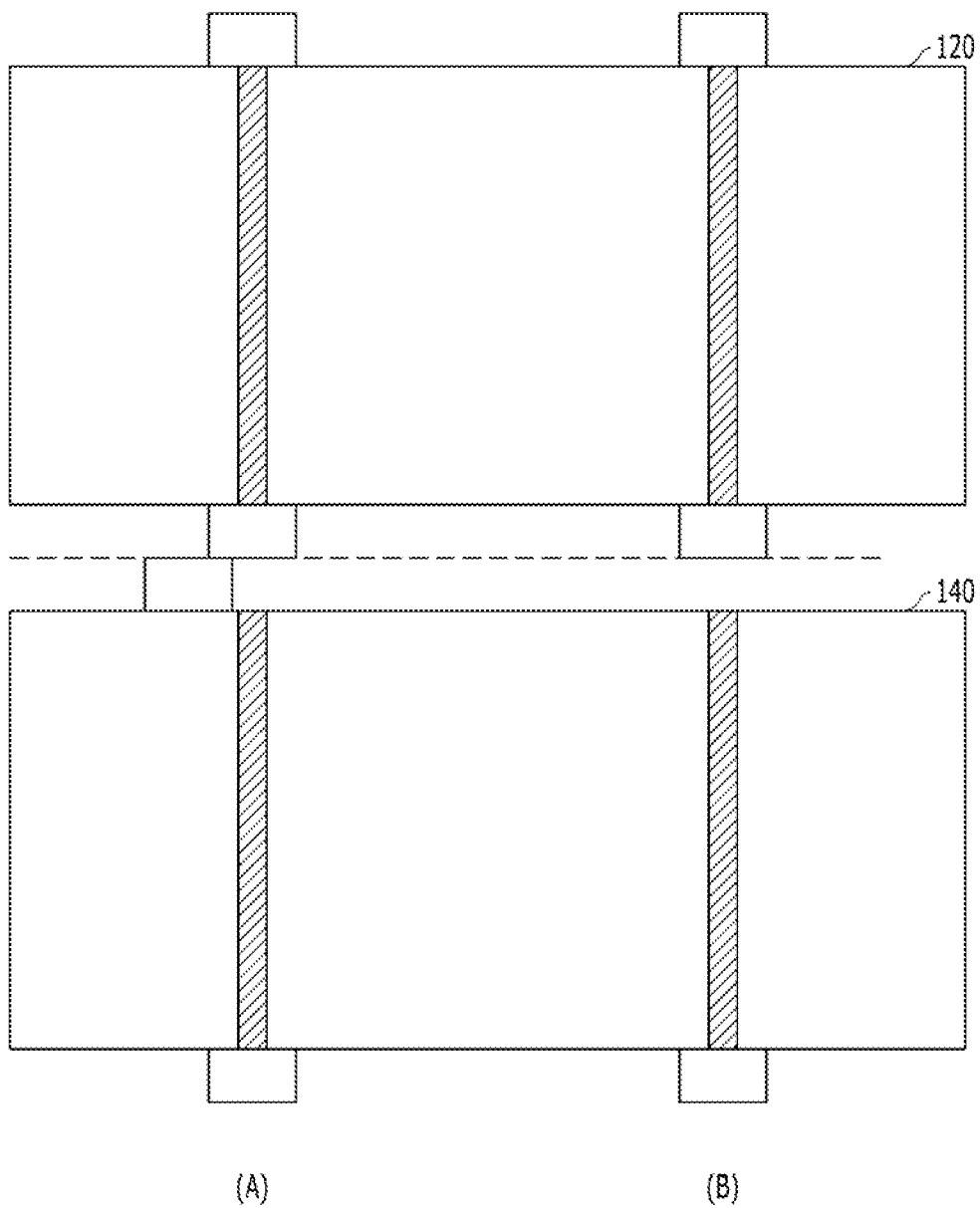
FIG. 2 is a schematic sectional view illustrating a TSV in a plurality of stacked chips in accordance with a prior art.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
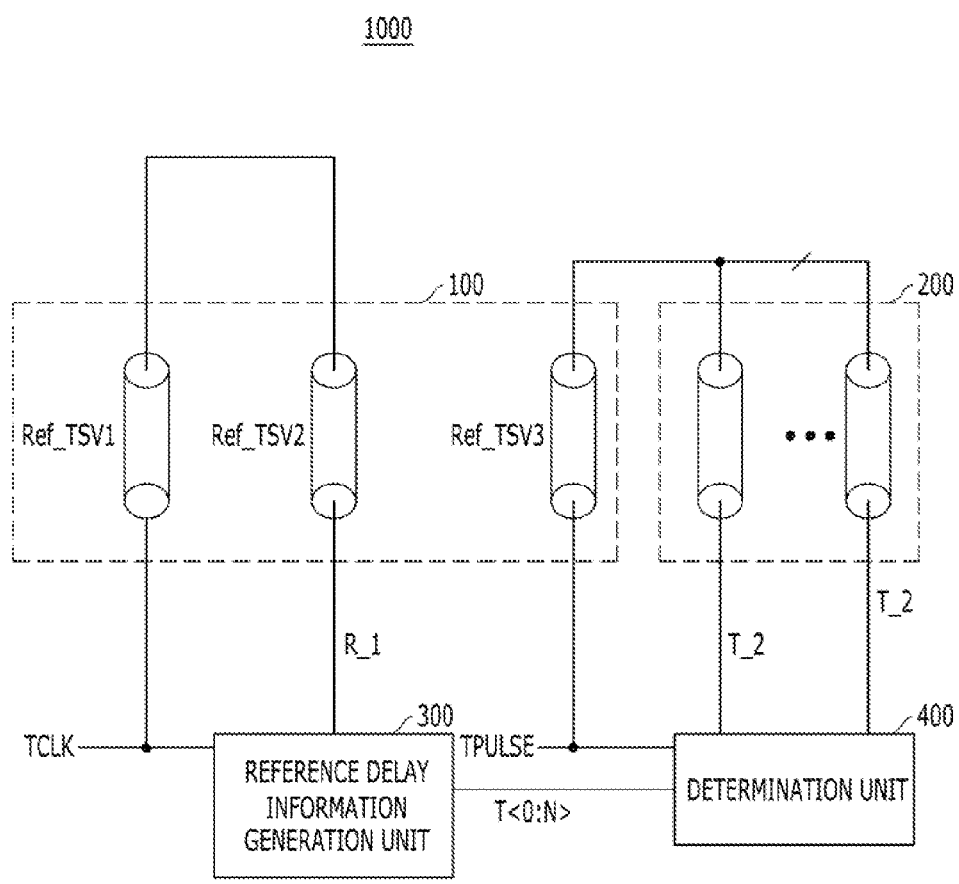
FIG. 3 is a block diagram illustrating a semiconductor device in accordance with an embodiment of the present invention.

FIG. 3 is a block diagram illustrating a semiconductor device in accordance with an embodiment of the present invention.

Referring to FIG. 3, the semiconductor device 1000 may include a reference TSV set 100, a plurality of TSVs 200, a reference delay information generation unit 300 and a determination unit 400.

The reference TSV set 100 and the plurality of TSVs 200 may be coupled to one another and penetrate through a plurality of stacked chips (not shown). The reference TSV set 100 may include first to third reference TSVs Ref_TSV1, TSV Ref_TSV2 and TSV Ref_TSV3.

A test clock signal TCLK may be input to the reference delay information generation unit 300 through 2 paths. The test clock signal TCLK may pass through the first and second reference TSVs Ref_TSV1 and Ref_TSV2 and be input as a first delay signal R_1 to the reference delay information generation unit 300. Also, the test clock signal TCLK may be input directly to the reference delay information generation unit 300.

An initial test signal TPULSE may be input to the determination unit 400 through various paths. The initial test signal TPULSE may be directly input to the determination unit 400. Further, the initial test signal TPULSE may pass through the third reference TSV Ref_TSV3 and each of the plurality of TSVs 200 and be input to the determination unit 400 as a plurality of second test signals T_2<0:N>.

For example, the first to the third reference TSVs Ref_TSV1, Ref_TSV2, and Ref_TSV3 may have the same amount of delay. The safety of a test for the reference TSV set 100 may be guaranteed because one or more holes are formed for the reference TSV set 100 in addition to existing holes for the normal TSVs 200.

The reference delay information generation unit 300 may receive the test clock signal TCLK and the first delay signal R_1, which is delayed version of the test clock signal TCLK delayed by the first and second reference TSVs Ref_TSV1 and Ref_TSV2, measure the amount of delay taken for the test clock signal TCLK to pass through the first and second reference TSVs Ref_TSV1 and Ref_TSV2 based on the received test clock signal TCLK and the received first delay signal R_1 and generate reference delay information T<0:N> based on the measurement. The reference delay information T<0:N> may indicate reference amount of delay used for abnormality test to the plurality of TSVs 200

The determination unit 400 may receive the initial test signal TPULSE, the reference delay information T<0:N> output from the reference delay information generation unit 300 and the plurality of second test signals T_2<0:N>, each of which is delayed version of the initial test signal TPULSE delayed by the third reference TSV Ref_TSV3 and each of the plurality of TSVs 200, respectively.

The determination unit 400 may compare a first test signal T_with each of a plurality of second test signals T_2<0:N>. The first test signal T_1 may be delayed version of initial test signal TPULSE delayed by the amount of delay corresponding to the reference delay information T<0:N>. The initial test signal TPULSE may be a pulse signal.

Accordingly, the determination unit 400 may determine abnormality of each of the plurality of TSVs 200 through the result of comparison between the first test signal T_1 and each of the plurality of TSVs 200.

The semiconductor device in accordance with the embodiment of the present invention is described below in more detail.

Figure 4:
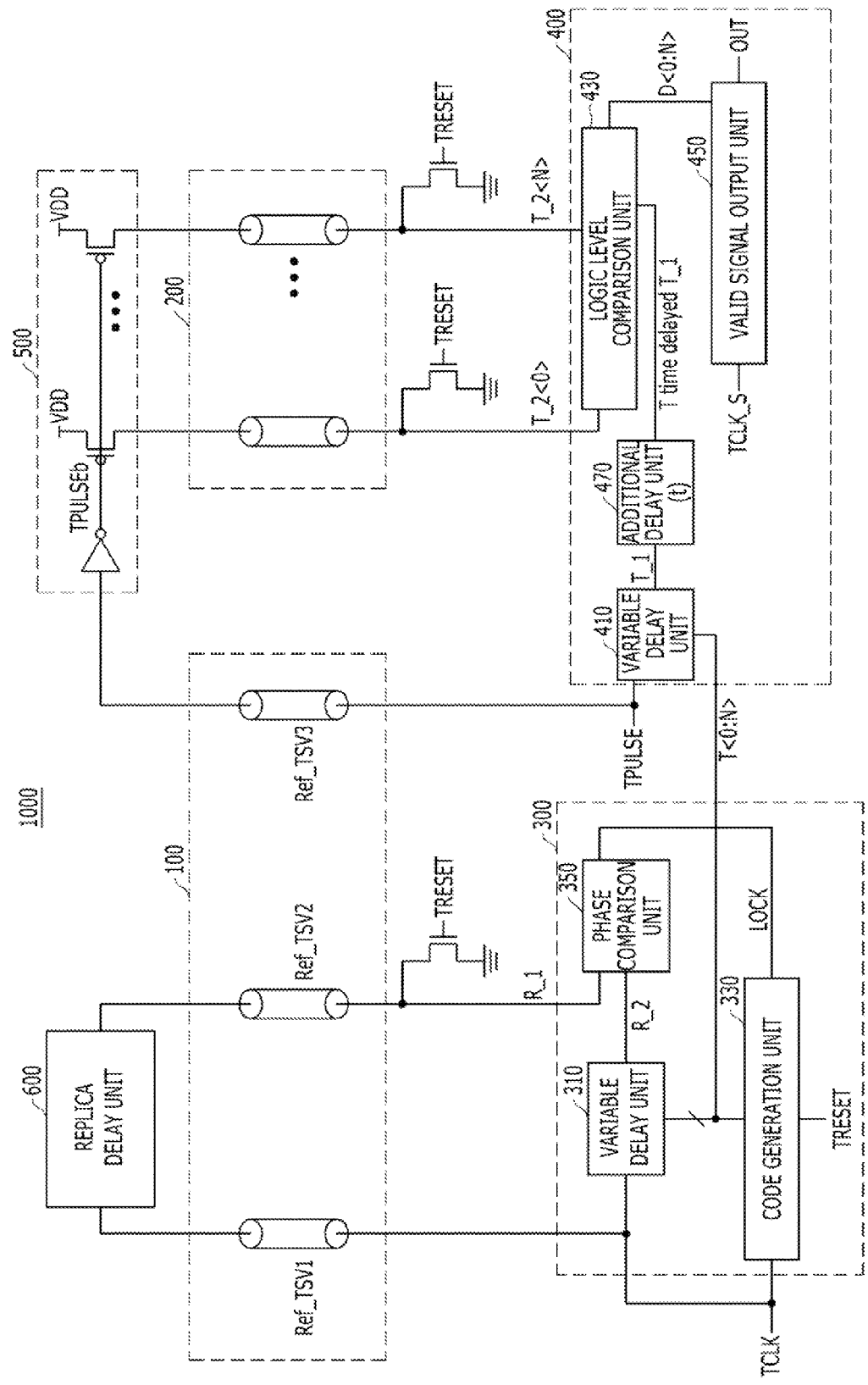
FIG. 4 is a detailed block diagram illustrating the semiconductor device shown in FIG. 3.

FIG. 4 is a detailed circuit diagram illustrating the semiconductor device shown in FIG. 3.

Referring to FIG. 4, the semiconductor device 1000 may include the reference TSV set 100, the plurality of TSVs 200, the reference delay information generation unit 300, the determination unit 400, a power supply unit 500, and a 600.

As described above, the reference TSV set 100 and the plurality of TSVs 200 may be coupled to one another and penetrate through a plurality of stacked chips (not shown). The reference TSV set 100 may include the first to third reference TSVs Ref_TSV1, TSV Ref_TSV2 and TSV Ref_TSV3. The first to the third reference TSVs Ref_TSV1, Ref_TSV2 and Ref_TSV3 may have the same amount of delay. The test clock signal TCLK may be input to the reference delay information generation unit 300 through 2 paths. The test clock signal TCLK may pass through the first and second reference TSVs Ref_TSV1 and Ref_TSV2 and be input as a first delay signal R_1 to the reference delay information generation unit 300. Also, the test clock signal TCLK may be input directly to the reference delay information generation unit 300.

The initial test signal TPULSE may be input to the determination unit 400 through various paths. The initial test signal TPULSE may be directly input to the determination unit 400. Further, the initial test signal TPULSE may pass through the third reference TSV Ref_TSV3 and each of the plurality of TSVs 200 and be input to the determination unit 400 as a plurality of second test signals T_2<0:N>.

An output terminal of the second reference TSV Ref_TSV2 may be coupled to a drain of an NMOS transistor that responds to a test reset signal TRESET. The NMOS transistor receives the test reset signal TRESET through its gate and resets the first delay signal R_1 to a first voltage, for example, a ground voltage VSS.

The reference delay information generation unit 300 may include a variable delay unit 310, a code generation unit 330 and a phase comparison unit 350. The reference delay information generation unit 300 may receive the test clock signal TCLK and the first delay signal R_1, which is delayed version of the test clock signal TCLK delayed by the first and second reference TSVs Ref_TSV1 and Ref_TSV2, measure the amount of delay taken for the test clock signal TCLK to pass through the first and second reference TSVs Ref_TSV1 and Ref_TSV2 based on the received test clock signal TCLK and the received first delay signal R_1 and generate reference delay information T<0:N> based on the measurement.

The variable delay unit 310 may generate a second delay signal R_2 by variably delaying the test clock signal TCLK in response to the reference delay information T<0:N> received from the code generation unit 330. The variable delay unit 310 is described later with reference to FIG. 6. The reference delay Information T<0:N> may be a digital code signal.

The code generation unit 330 may generate the reference delay information T<0:N> in order to control the amount of delay of the variable delay unit 310 in response to a comparison result signal LOCK received from the phase comparison unit 350. The code generation unit 330, which may be synchronized with the test clock signal TCLK, may shift the reference delay information T<0:N> in predetermined order during activation the comparison result signal LOCK. The code generation unit 330 may stop the shifting operation of the reference delay information T<0:N> in response to deactivation of the comparison result signal LOCK and then output the reference delay information T<0:N>. This is described alter with reference to FIG. 7.

The phase comparison unit 350 may compare phases of the first delay signal R_1 and the second delay signal R_2 and activate or deactivate the comparison result signal LOCK based on a result of the comparison. The phase comparison unit 350 may activate the comparison result signal LOCK during phases of the first delay signal R_1 and the second delay signal R_2 are not identical. The phase comparison unit 350 may deactivate the comparison result signal LOCK when phases of the first delay signal R_1 and the second delay signal R_2 are identical. For example, the phase comparison unit 350 may be formed of a D flip-flop D-FF including a data terminal D, an output terminal Q, a clock terminal CLK and a reset terminal RST. The data terminal D may be supplied with the first delay signal R_1 and the clock terminal CLK may be supplied with the second delay signal R_2. The D flip-flop D-FF may output the first delay signal R_1, which is received through the data terminal D, to the output terminal Q in synchronized with the second delay signal R_2. The output signal may be transferred to the code generation unit 330 as the comparison result signal LOCK.

The reference delay information generation unit 300 may perform a negative feedback operation for repeatedly comparing phases of the first delay signal R_1 and the second delay signal R_2 until the first delay signal R_1 and the second delay signal R_2 have the same phase.

The replica delay unit 600 may have an amount of delay corresponding to an amount of operation delay of a power supply unit 500, which will be described later. The replica delay unit 600 may be coupled between the first reference TSV Ref_TSV1 and the second reference TSV Ref_TSV2. The amount of delay corresponding to an amount of operation delay of the power supply unit 500 may be obtained by equivalently modeling an amount of delay that may be generated due to line delay of signals between an inverter and a plurality of transistors of the power supply unit 500.

The determination unit 400 may include a variable delay unit 410, a logic level comparison unit 430, a valid signal output unit 450, and an additional delay unit 470.

As described above, the determination unit 400 may receive the initial test signal TPULSE, the reference delay information T<0:N> output from the reference delay information generation unit 300 and the plurality of second test signals T_2<0:N>, each of which is delayed version of the initial test signal TPULSE delayed by the third reference TSV Ref_TSV3 and each of the plurality of TSVs 200, respectively.

The determination unit 400 may compare the first test signal T_1 with each of a plurality of second test signals T_2<0:N>. The first test signal T_1 may be delayed version of initial test signal TPULSE delayed by the amount of delay corresponding to the reference delay information T<0:N>. The initial test signal TPULSE may be a pulse signal.

The variable delay unit 410 may delay the initial test signal TPULSE by a delay amount corresponding to the reference delay information T<0:N> and output the delayed signal as the first test signal T_1. The variable delay unit 410 is described later with reference to FIG. 6.

The additional delay unit 470 may further delay the first test signal T_1 by a predetermined amount of margin 't' in order to prevent fail of comparison between the first test signal T_1 and the plurality of second test signals T_2<0:N>, which may cause fall in determining abnormality of the plurality of TSVs 200 after package.

The logic level comparison unit 430 may compare logic levels of the first test signal T_1 and each of the plurality of second test signals T_2<0:N> and generate a plurality of valid signals D<0:N> based on the results of the comparison. The logic level comparison unit 430 may include a plurality of D flip-flops D-FF. Each of the D flip-flops D-FF may include a data terminal D, a clock terminal CLK, an output terminal Q and a reset terminal RST. The data terminals D of the D flip-flops D-FF may be supplied with the respective second test signals T_2<0:N>, and the clock terminals CLK of the D flip-flops D-FF may be supplied with the first test signal T_1. The D flip-flops D-FF compare the second test signals T_2<0:N> with the first test signal T_1 in synchronism with the first test signal T_and output results of the comparison as the valid signals D<0:N>.

The valid signal output unit 450 may serialize the plurality of parallel valid signals D<0:N> into a valid signal D<0> in response to a monitoring clock signal TCLK_S and output the valid signal D<0> to the logic level comparison unit 430. The monitoring clock signal TCLK_S may be a shifting clock signal for serializing the plurality of valid signals D<0:N>. For example, the monitoring clock signal TCLK_S may be a specific clock signal or the test clock signal TCLK delayed by a specific time. The valid signal output unit 450 is described later with reference to FIG. 8.

The power supply unit 500 may supply the plurality of TSVs 200 with a power source voltage, for example, VDD in response to the initial test signal TPULSE input through the third reference TSV Ref_TSV3. The power supply unit 500 may include an inverter and a plurality of PMOS transistors. The inverter may be coupled with gates of the plurality of PMOS transistors. Sources of the plurality of PMOS transistors may be coupled with the power source voltage VDD and drains thereof may be respectively coupled with corresponding ones of the plurality of TSVs 200. The initial test signal TPULSE after passing through the third reference TSV Ref_TSV3 may be applied to the gates of the plurality of PMOS transistors via the inverter. The plurality of PMOS transistors, which are turned on, may supply the power source voltage VDD to the plurality of TSVs 200, thereby forming a current path on each of the plurality of TSVs 200. An electric current may be supplied to the plurality of TSVs 200 along the formed current path. That is, since the plurality of TSVs 200 is coupled with the plurality of PMOS transistors, the plurality of TSVs 200 may perform a test operation using an electric current supplied by the power supply unit 500 in a test mode while transferring signals between stacked chips in a normal operation.

Output terminals of the plurality of TSVs 200 may be coupled with the respective drains of NMOS transistors for resetting the plurality of second test signals T_2<0:N>. A test reset signal TRESET may be supplied to a gate of each of the NMOS transistors, so the NMOS transistor may reset the second test signal T_2<0:N> to the ground voltage.

The overall operation of the semiconductor device 1000 is described below.

First, the test clock signal TCLK may be applied to the first reference TSV Ref_TSV1 and the reference delay information generation unit 300. The test clock signal TCLK applied to the first reference TSV Ref_TSV1 may sequentially pass through the first reference TSV Ref_TSV1, the replica delay unit 600 and the second reference TSV Ref_TSV2 with the result that the test clock signal TCLK is output as the first delay signal R_1. That is, the test clock signal TCLK may be delayed while sequentially passing through the first reference TSV Ref_TSV1, the replica delay unit 600 and the second reference TSV Ref_TSV2 and then output as the first delay signal R_1.

On the other hand, the test clock signal TCLK directly applied to the reference delay information generation unit 300 may be applied to the variable delay unit 310. The variable delay unit 310 may delay the test clock signal TCLK in response to the reference delay information T<0:N> input from the code generation unit 330. The test clock signal TCLK delayed by the variable delay unit 310 may be the second delay signal R_2.

The first delay signal R_1 and the second delay signal R_2 may be applied to the phase comparison unit 350. The phase comparison unit 350 may compare phases of the first delay signal R_1 and the second delay signal R_2 and output the comparison result signal LOCK based on the result of the comparison. When phases of the first delay signal R_1 and the second delay signal R_2 are the same, the comparison result signal LOCK is deactivated and the reference delay information T<0:N> being shifted by the code generation unit 330 during activation of the comparison result signal LOCK may be output to the determination unit 400. Accordingly, the reference delay information T<0:N> may be generated by passing test clock signal TCLK through the first reference TSV Ref_TSV1, the replica delay unit 600 and the second reference TSV Ref_TSV2. The reference delay information T<0:N> may indicate a reference delay amount for the plurality of TSVs 200. The reference delay information T<0:N> including digital codes may be transferred to the variable delay unit 410 of the determination unit 400.

The initial test signal TPULSE may be applied to the third reference TSV Ref_TSV3 and the variable delay unit 410. The initial test signal TPULSE directly applied to the variable delay unit 410 may be delayed by the amount of delay corresponding to the reference delay information T<0:N>. The first test signal T_1 output from the variable delay unit 410 may be applied to the additional delay unit 470 by which the first test signal T_1 may be further delayed by the predetermined amount of margin 't' and then transferred to the logic level comparison unit 430.

The initial test signal TPULSE may be applied to the power supply unit 500 via the third reference TSV Ref_TSV3. The electric current may flow on each of the plurality of TSVs 200 in response to the initial test signal TPULSE. The electric currents may experience delay by each of the plurality of TSVs 200 and be applied to the logic level comparison unit 430 as the plurality of second test signals T_2<0:N>.

The logic level comparison unit 430 may compare logic levels of the first test signal T_1 and each of the plurality of second test signals T_2<0:N> and generate a plurality of valid signals D<0:N> based on the results of the comparison.

If a logic level of the output valid signal D<n> is not identical with that of the first test signal T_1, a corresponding TSV may be determined to be a TSV having an abnormal AC signal transfer characteristic. The first test signal T_1 is delayed version of the initial test signal TPULSE delayed by the amount of delay corresponding to the reference delay information T<0:N>. Thus, abnormality of each of the plurality of TSVs 200 may be determined by comparing the first test signal T_with each of the second test signals T_2<0:N>, each of which is delayed version of the initial test signal TPULSE delayed by the third reference TSV Ref_TSV3 and each of the plurality of TSVs 200, respectively.

Figure 5A:
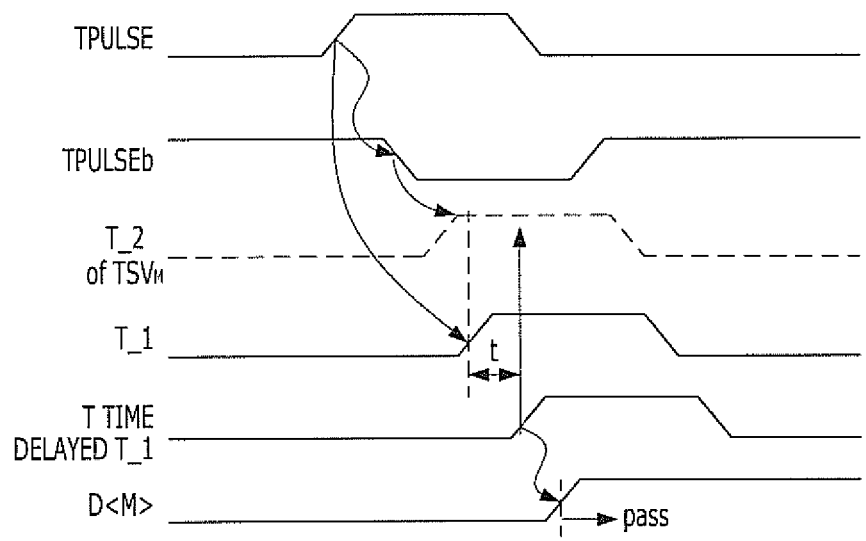
FIGS. 5A and 5B are a timing diagram illustrating operation of the semiconductor device shown in FIG. 3.
Figure 5B:
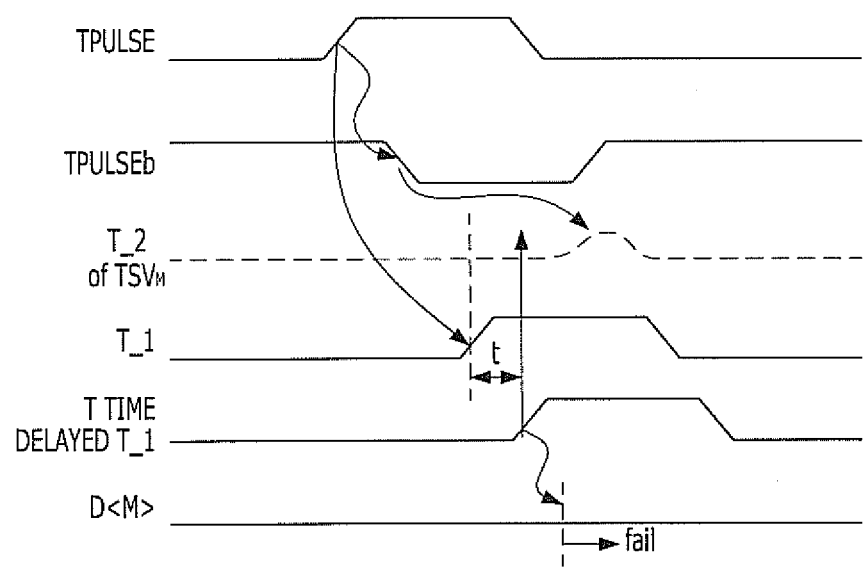

FIGS. 5A and 5B are timing diagrams illustrating operation of the semiconductor device shown in FIG. 3.

FIG. 5A shows Mth one (M is an integer equal to or lesser than N and equal to greater than zero) of the plurality of TSVs 200 to be determined normal. A phase of the first test signal T_1, in which the amount of delay corresponding to the reference delay information T<0:N> is reflected, may be identical with or later than a phase of the second test signal T_2<0:N>. The first test signal T_1 may further delayed by the additional delay unit 470 by the predetermined amount of margin 't' in order to prevent fail of comparison between the first test signal T_1 and the plurality of second test signals T_2<0:N>. The phases of the first delay signal R_1 and the second delay signal R_2 may be matched through the negative feedback operation with the variable delay unit 310, the code generation unit 330 and the phase comparison unit 350. Accordingly, when the first test signal T_1 and the second test signal T_2<0:N> of an Mth one of the plurality of TSVs 200 have the same phase, the Mth TSV of the plurality of TSVs 200 may be determined to be normal. As a result, the corresponding Mth one D<M> of the plurality of valid signals D<0:N> with a logic high level may be output from the valid signal output unit 450 because a logic level of the second test signal T_2<0:N> of the Mth TSV of the plurality of TSVs 200 is high when compared with a logic level of the first test signal T_1 after the delay time 't'.

FIG. 5B shows Mth TSV of the plurality of TSVs 200 to be determined abnormal. The Mth one D<M> of the plurality of valid signals D<0:N> with a logic low level may be output from the valid signal output unit 450 because the second test signal T_2<0:N> of the Mth TSV of the plurality of TSVs 200 is low when compared with the logic level of the first test signal T_1 delayed by the predetermined amount of margin 't'. Accordingly, the normal AC signal transfer characteristic of the Mth TSV of the plurality of TSVs 200 may be determined abnormal.

Figure 6:
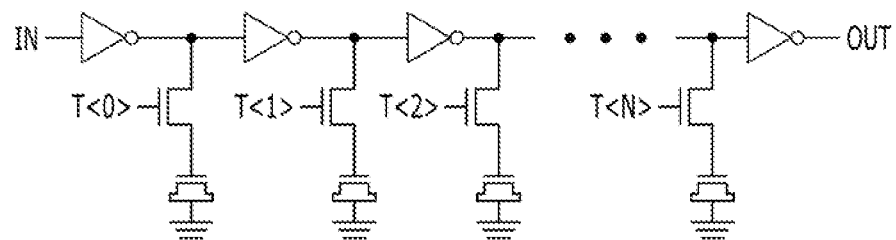
FIG. 6 is a circuit diagram illustrating a variable delay unit of the semiconductor device shown in FIG. 4.

FIG. 6 is a detailed circuit diagram illustrating one of the variable delay units 310 and 410 of the semiconductor device 1000 shown in FIG. 4. The variable delay units 310 of the reference delay information generation unit 300 and the determination unit 400 have the same structure. The input signal IN may be the test clock signal TCLK or the initial test signal TPULSE.

Referring to FIG. 6, the variable delay unit 310 for example may include inverters that form a delay chain and NMOS transistors and NMOS capacitors that respond to the reference delay information T<0:N>. Drains of each of the NMOS transistors may be coupled between the delay-chained inverters. Sources of the NMOS transistor may be coupled to the NMOS capacitor.

When all the reference delay information T<0:N> become low, the test clock signal TCLK may be delayed by the least amount of delay by the delay-chained inverter. As the reference delay information T<0:N> become sequentially high, the test clock signal TCLK may be delayed by sequentially increasing amount of delay by the delay-chained inverter. The delay of the variable delay unit 310 may be implemented with an active element utilizing gate delay as described or a passive element utilizing a resistor or a capacitor.

Figure 7:
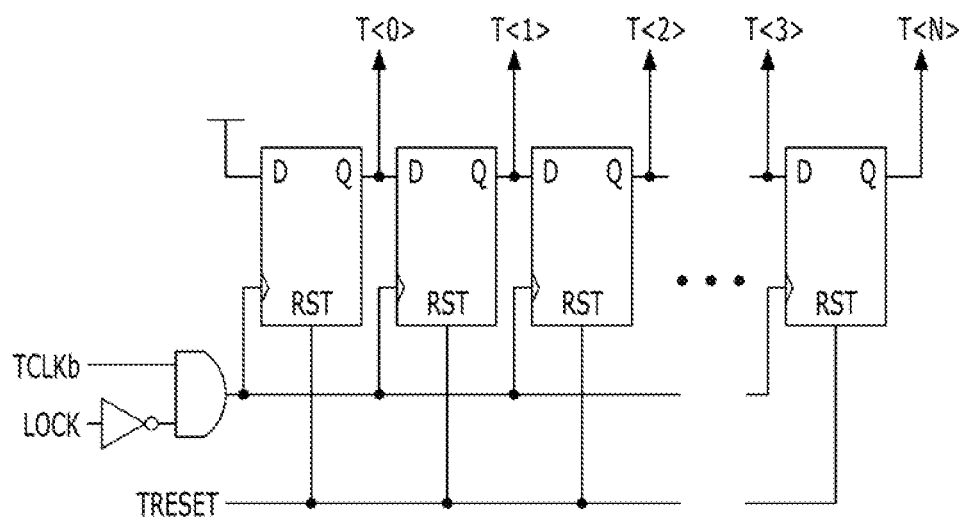
FIG. 7 is a circuit diagram illustrating a code generation unit of the semiconductor device shown in FIG. 4.

FIG. 7 is a circuit diagram illustrating the code generation unit 330 of the semiconductor device 1000 shown in FIG. 4.

Referring to FIG. 7, the code generation unit 330 may include a plurality of D flip-flops D-FF, an AND gate AND and an inverter. Each of the D flip-flops D-FF may include a data terminal D, a clock terminal CLK, an output terminal Q and a reset terminal RST. The output terminal Q of the D flip-flop D-FF may be coupled with the data terminal D of a next D flip-flop D-FF. Input to the first D flip-flop D-FF may be set as a specific level 'high' or 'low'. The clock terminals CLK of the D flip-flops D-FF may be coupled with the AND gate AND. The reset terminals RST of the D flip-flops D-FF may be coupled with the test reset signal TRESET, thus resetting the corresponding D flip-flops D-FF upon test reset. An inverted test clock signal TCLKb and the comparison result signal LOCK whose phase has been inverted by the inverter may be applied to the AND gate AND. A signal inputted to the clock terminal CLK may be controlled in response to the comparison result signal LOCK. When the comparison result signal LOCK is activated, the inverted test clock signal TCLKb may be transferred to the clock terminal CLK of the D flip-flop D-FF via the AND gate AND, so an input signals to the data terminal D may be output. The output signal T<0> may be inputted to a next D flip-flop D-FF and then output as the output signal T<1> in synchronism with the clock terminal CLK. Accordingly, the output signals T<0:N> of the output terminals Q of the D flip-flops D-FF may become signals shifted from the signals of the data terminals D in synchronism with the signals of the clock terminals CLK. When the comparison result signal LOCK is deactivated, a shifting operation may be stopped because the inverted test clock signal TCLKb does not pass through the AND gate AND. In the semiconductor device 1000 in accordance with one embodiment of the present invention, the code generation unit 330 has been illustrated as including the plurality of D flip-flops D-FF, but the code generation unit 330 may include any means for shifting input signals at specific intervals in synchronism with a clock signal and outputting the shifted signals.

Figure 8:
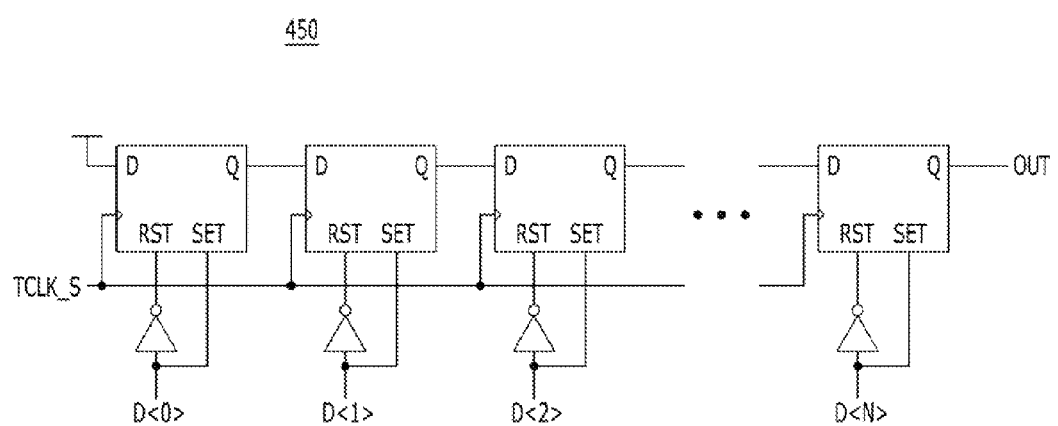
FIG. 8 is a circuit diagram illustrating a valid signal output unit of the semiconductor device shown in FIG. 4.

FIG. 8 is a circuit diagram illustrating the valid signal output unit 450 of the semiconductor device 1000 shown in FIG. 4.

Referring to FIG. 8, the valid signal output unit 450 may include a plurality of D flip-flops D-FF and inverters. Signals may be inputted to the data terminal D, the clock terminal CLK, the reset terminal RST and the set terminal SET of each of the D flip-flops D-FF and a signal may be output from the output terminal Q of the D flip-flop D-FF. The clock terminal CLK may function to transfer a signal, which is inputted to the data terminal D of the D flip-flop D-FF, to the output terminal Q. The clock terminal CLK may receive a monitoring clock signal TCLK_S that is used when outputting the serialized valid signals D<0:N>, which indicates the results of the comparison between logic levels of the first test signal T_1 and each of the plurality of second test signals T_2<0:N>. The plurality of valid signals D<0:N> output from the logic level comparison unit 430 whose phases have been inverted by the inverters may be inputted to the reset terminals RST of the D flip-flops D-FF. The valid signals D<0:N> output from the logic level comparison unit 430 may be inputted to the set terminals SET of the D flip-flops D-FF. The signals of the reset terminal RST and the set terminal SET may be used to reset the signal of the output terminal Q. When the signal of the reset terminal RST has a logic high level, an initial value of the output terminal Q may become low. When the signal of the set terminal SET has a logic high level, the initial value of the output terminal Q may become high. The plurality of valid signals D<0:N> output from the logic level comparison unit 430 may determine signal values of the reset terminal RST and the set terminal SET. The determined values may be shifted in response to the monitoring clock signal TCLK_S inputted to the clock terminals CLK of the D flip-flops D-FF and output as a serialized signal OUT that may be continuously monitored. For example, in the aforementioned embodiment, the valid signal output unit 450 has been illustrated as including the plurality of D flip-flops D-FF, but the valid signal output unit 450 may include any means for shifting a plurality of input signals at specific intervals in synchronism with a clock signal and outputting the shifted signals. Furthermore, a location and type of the logic gate illustrated in the aforementioned embodiment may be different depending on the polarity of an input signal.

As described above, the semiconductor device 1000 may determine abnormality of a TSV and increase reliability of a memory device using a result of the determination.

The semiconductor device in accordance with the embodiment may stop unnecessary process by determining abnormality of a TSV after packaging stacked chips and increases productivity by reducing production cost for semiconductor devices.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a plurality of stacked chips;
   a reference through silicon via (TSV) set passing through the plurality of stacked chips;
   a plurality of TSVs passing through the plurality of stacked chips;
   a reference delay information generation unit suitable for generating a reference delay information indicating an amount of delay of the reference TSV set; and
   a determination unit suitable for determining abnormality of the plurality of TSVs by comparing a first test signal with each of a plurality of second test signals,
   wherein the first test signal is an initial test signal delayed by an amount of delay corresponding to the reference delay information, and
   wherein each of the plurality of second test signals is the initial test signal delayed by corresponding one of the plurality of TSVs.

2. The semiconductor device of claim 1, wherein the reference TSV set comprises:
   a first and second reference TSVs, through which a test clock signal passes; and
   a third reference TSV, through which the initial test signal passes, and
   wherein the amount of delay of the reference TSV set is measured with the test clock signal.

3. The semiconductor device of claim 2, wherein the first to the third reference TSVs have an identical amount of delay.

4. The semiconductor device of claim 3, further comprising a power supply unit suitable for supplying an electric current to the plurality of TSVs in response to the initial test signal that is applied through the third reference TSV.

5. The semiconductor device of claim 4, further comprising a replica delay unit coupled between the first reference TSV and the second reference TSV and having the same amount of operation delay as the power supply unit.

6. The semiconductor device of claim 2, wherein the reference delay information generation unit comprises:
a variable delay unit suitable for generating a second delay signal by variably delaying the test clock signal by an amount of variable delay in response to digital codes indicating the amount of variable delay;
a code generation unit suitable for generating the digital codes in response to a comparison signal; and
a phase comparison unit suitable for comparing phases of a first delay signal and the second delay signal and generate the comparison signal based on a result of the comparison,
wherein the first delay signal is the test clock signal delayed by the first and second reference TSVs.

7. The semiconductor device of claim 6, wherein the code generation unit adjusts values of the digital codes until phases of the first delay signal and the second delay signal are identical and outputs the adjusted digital codes as the reference delay information in response to the comparison signal.

8. The semiconductor device of claim 1, wherein the determination unit comprises:
a variable delay unit suitable for generating the first test signal by delaying the initial test signal by an amount of delay corresponding to the reference delay information; and
a logic level comparison unit suitable for generating a plurality of valid signals for determining abnormality of each of the plurality of TSVs based on results of comparison of logic levels of the first test signal and each of the plurality of second test signals.

9. The semiconductor device of claim 8, wherein the determination unit further comprises a valid signal output unit suitable for serializing the plurality of valid signals, which is generated in parallel, in response to a monitoring clock signal and outputting the serialized signal.

10. The semiconductor device of claim 9, wherein the determination unit further comprises an additional delay unit suitable for additionally delaying the first test signal generated from the variable delay unit by a predetermined amount of margin and transferring the first test signal, which is additionally delayed, to the logic level comparison unit.

11. An operating method of a semiconductor device comprising a plurality of stacked chips, a reference through silicon via (TSV) set passing through the plurality of stacked chips and a plurality of TSVs passing through the plurality of stacked chips, comprising:
generating a reference delay information indicating an amount of delay of the reference TSV set; and
determining abnormality of the plurality of TSVs by comparing a first test signal with each of a plurality of second test signals,
wherein the first test signal is an initial test signal delayed by an amount of delay corresponding to the reference delay information, and
wherein each of the plurality of second test signals is the initial test signal delayed by corresponding one of the plurality of TSVs.

12. The operating method of claim 11, wherein the reference TSV set comprises:
a first and second reference TSVs, through which a test clock signal passes; and
a third reference TSV, through which the initial test signal passes, and
wherein the first to the third reference TSVs have an identical amount of delay.

13. The operating method of claim 12, wherein the generating of the reference delay information comprises:
generating a first delay signal by passing the test clock signal through the first and second reference TSVs;
generating a second delay signal by variably delaying the test clock signal by an amount of variable delay in response to digital codes indicating the amount of variable delay;
generating the digital codes in response to a comparison signal;
comparing phases of the first delay signal and the second delay signal; and
generating the comparison signal based on a result of the comparing.

14. The operating method of claim 13, wherein the generating of the reference delay information comprises:
adjusting values of the digital codes until phases of the first delay signal and the second delay signal are identical; and
outputting the adjusted digital codes as the reference delay information in response to the comparison signal.

15. The operating method of claim 12, wherein the plurality of second test signals are generated bypassing the initial test signal through the third reference TSV and the plurality of TSVs.

16. The operating method of claim 15, wherein the determining of abnormality of the plurality of TSVs comprises:
generating the first test signal by delaying the initial test signal by an amount of delay corresponding to the reference delay information; and
generating each of a plurality of valid signals for determining abnormality of each of the plurality of TSVs based on results of comparison of logic levels of the first test signal and each of the plurality of second test signals.

17. The operating method of claim 16, wherein the determining of abnormality of the plurality of TSVs further comprises additionally delaying the first test signal generated by the generating the first test signal by a predetermined amount of margin before the generating each of the plurality of valid signals.

18. The operating method of claim 16, wherein the determining of abnormality of the plurality of TSVs further comprises:
serializing the plurality of valid signals, which is generated in parallel, in response to a monitoring clock signal; and
outputting the serialized signal.

* * * * *